(12) United States Patent
Shen et al.

(10) Patent No.: US 9,040,329 B2
(45) Date of Patent: May 26, 2015

(54) LIGHT EMITTING DIODE AND MANUFACTURING METHOD THEREOF

(75) Inventors: Chia-Hui Shen, Hsinchu (TW); Tzu-Chien Hung, Hsinchu (TW)

(73) Assignee: Zhongshan Innocloud Intellectual Property Services Co., Ltd., Zhongshan (CN)

( * ) Notice: Subject to any disclaimer, the term of this patent is extended or adjusted under 35 U.S.C. 154(b) by 242 days.

(21) Appl. No.: 13/463,821

(22) Filed: May 4, 2012

(65) Prior Publication Data

US 2013/0032839 A1 Feb. 7, 2013

(30) Foreign Application Priority Data

Aug. 5, 2011 (CN) .......................... 2011 1 0223887

(51) Int. Cl.
| | |
|---|---|
| *H01L 33/22* | (2010.01) |
| *H01L 33/32* | (2010.01) |
| *H01L 33/00* | (2010.01) |
| H01L 33/24 | (2010.01) |
| H01L 33/40 | (2010.01) |
| H01L 33/42 | (2010.01) |

(52) U.S. Cl.
CPC .............. *H01L 33/007* (2013.01); *H01L 33/22* (2013.01); *H01L 33/24* (2013.01); *H01L 33/32* (2013.01); *H01L 33/40* (2013.01); *H01L 33/42* (2013.01); *H01L 2933/0016* (2013.01)

(58) Field of Classification Search
USPC ........................................................... 438/32
See application file for complete search history.

(56) References Cited

U.S. PATENT DOCUMENTS

| | | | | |
|---|---|---|---|---|
| 6,809,340 | B2* | 10/2004 | Kato et al. ....................... | 257/79 |
| 6,893,889 | B2* | 5/2005 | Park et al. ........................ | 438/22 |
| 7,186,580 | B2* | 3/2007 | Tran et al. ........................ | 438/22 |
| 2006/0199289 | A1* | 9/2006 | Shei et al. ....................... | 438/21 |
| 2010/0078658 | A1* | 4/2010 | Lee et al. ........................ | 257/88 |
| 2010/0244053 | A1* | 9/2010 | Dai et al. ........................ | 257/79 |

FOREIGN PATENT DOCUMENTS

| | | |
|---|---|---|
| CN | 101661988 A | 3/2010 |
| CN | 101789477 A | 7/2010 |

* cited by examiner

*Primary Examiner* — Robert Carpenter
(74) *Attorney, Agent, or Firm* — Novak Druce Connolly Bove + Quigg LLP

(57) ABSTRACT

A manufacturing method for an LED with roughened lateral surfaces comprises following steps: providing an LED wafer with an electrically conductive layer disposed thereon; providing a photoresist layer on the electrically conductive layer; roughening a lateral surface of the electrically conductive layer by wet etching; forming a depression in the LED wafer by dry etching and roughening a sidewall of the LED wafer defining the depression; and disposing two pads respectively in the depression and the conducting layer. The disclosure also provides an LED with roughened lateral surfaces. A roughness of the roughened lateral surfaces is measurable in micrometers.

14 Claims, 5 Drawing Sheets

LIGHT EMITTING DIODE AND MANUFACTURING METHOD THEREOF

1. TECHNICAL FIELD

The disclosure relates to light emitting diodes (LEDs) and the manufacturing method thereof, and more particularly to an LED having roughened lateral surfaces.

2. DESCRIPTION OF THE RELATED ART

LEDs have low power consumption, high efficiency, quick reaction time, long lifetime, and the absence of toxic elements such as mercury during manufacturing. Many LEDs comprise a sapphire and an epitaxial layer disposed on the sapphire. An active layer (or a light emitting layer) located inside the epitaxial layer is configured for emitting light; however, the other layers of the epitaxial layer or the sapphire may absorb the emitted light to reduce a light emitting efficiency of the LED. The epitaxial layer and the sapphire have high refractive indexes, which is about 1.6~2.6, such that total reflections of the emitted light inside the LED may result in the useful light output being reduced. For solving foresaid limitations, an LED with roughened surfaces may be configured to make an LED having rough lateral surfaces, for which photo-enhancing chemical wet etching method (PEC) and an etchant such as potassium hydroxide (K.OH) may be used. However, such manufacturing method may add extra processing time, manpower and more manufacturing cost. Therefore, a new LED and its manufacturing method that overcome aforementioned deficiencies are required.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure.

DETAILED DESCRIPTION

Exemplary embodiments of the disclosure will be described with reference to the accompanying drawings.

Figure 1:
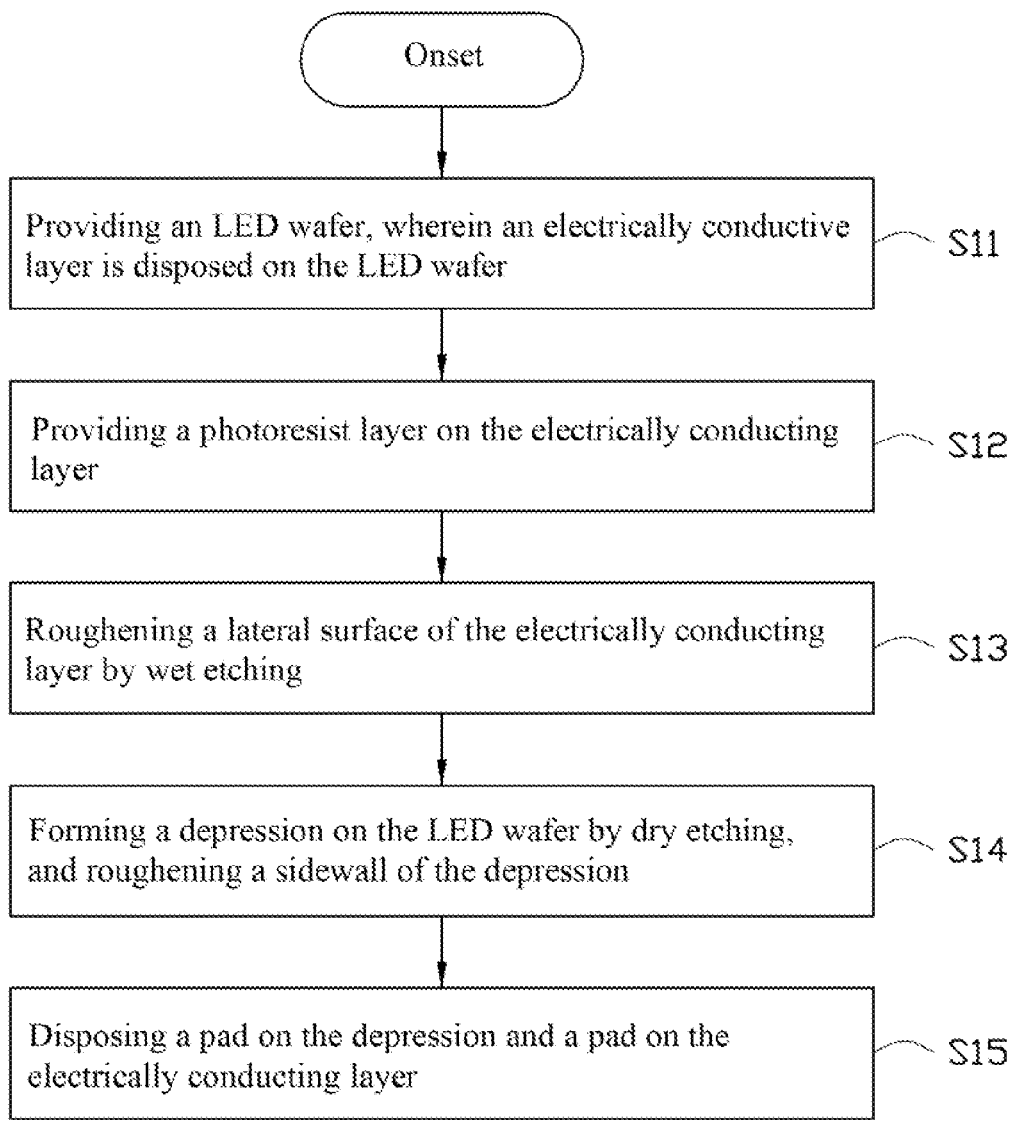
FIG. 1 is a flow chart showing a manufacturing method for an LED of the disclosure.
Figure 2:
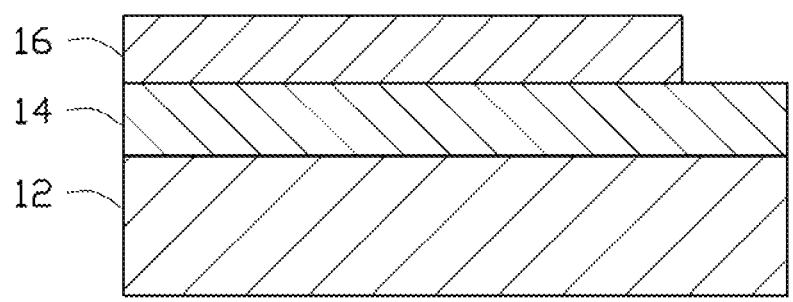
FIG. 2 is a cross section showing a step of providing a photoresist layer on an electrically connective layer in accordance with FIG. 1.

Referring to FIG. 1, the present disclosure provides a manufacturing method for an LED, comprising following steps:

In step S11, an LED wafer 12 is provided, wherein an electrically conductive layer 14 is disposed on the LED wafer 12, as shown in FIG. 2. In the embodiment, the LED wafer 12 comprises a substrate 120 and an epitaxial layer on the substrate 120. The epitaxial layer comprises an N-type epitaxial layer 121 on the substrate 120, a light emitting layer 123 on the N-type epitaxial layer 121 and a P-type epitaxial layer 125 on the light emitting layer 123. The electrically conductive layer 14 is on the P-type epitaxial layer 125 of the LED wafer 12. The electrically conductive layer 14 can be made by vapor deposition, and be composed of indium tin oxide (ITO). The substrate 120 can be sapphire, silicon carbide (SiC) or gallium nitride (GaN). The LED wafer 12 can be made of GaN compound, wherein the N-type epitaxial layer 121 is an N-type GaN layer, and the P-type epitaxial layer 125 is a P-type GaN layer.

In step S12, a photoresist layer 16 is formed on the electrically conductive layer 14, as shown in FIG. 2. In the embodiment, the photoresist layer 16 does not entirely encapsulate a top surface of the electrically conductive layer 14, whereby a portion of the top surface of the electrically conductive layer 14 is exposed. In one embodiment for a manufacturing method to form such structure, first, a flat photoresist layer is provided on the electrically conductive layer 14; then, the flat photoresist layer is patterned by an exposure developing process, whereby the required portion of the electrically conductive layer 14 is exposed from the photoresist layer 16.

Figure 3:
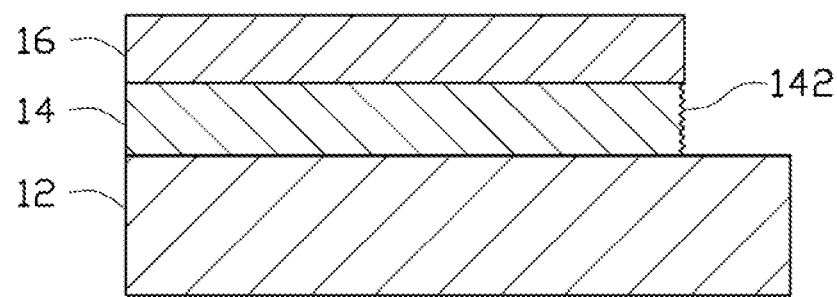
FIG. 3 is a cross section showing a step of roughening a lateral surface of the electrically conductive layer by wet etching in accordance with FIG. 1.

In step S13, a lateral surface 142 of the electrically conductive layer 14 is roughened by wet etching, as shown in FIG. 3. In the embodiment, the exposed portion of the electrically conductive layer 14 is also subjected to the wet etching, and the lateral surface 142 of the electrically conductive layer 14 is flush with a corresponding lateral surface of the photoresist layer 16. The wet etching process is a kind of isotropic etching with a lateral etching ability. Thus, in the wet etching process, when an etchant decomposes the exposed portion of the electrically conductive layer 14, the lateral surface 142 of the electrically conductive layer 14 is roughened. The etchant can be potassium hydroxide (K.OH), hydrochloric acid (H.Cl) or phosphoric acid ($H_3\{PO\}_4$). In the embodiment, the LED wafer 12 is made of a GaN compound which has a strong bonding strength to make the LED wafer 12 chemically stable. Moreover, the wet etching will not cause deterioration in or etching of the LED wafer 12.

Figure 4:
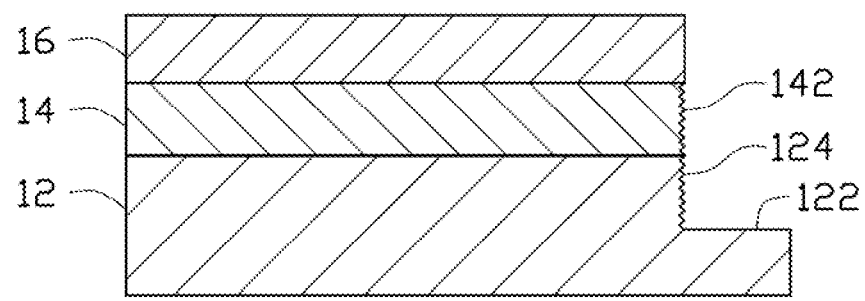
FIG. 4 is a cross section showing a step of forming a depression on an LED wafer by dry etching and roughening a sidewall of the depression in accordance with FIG. 1.

In step S14, a depression 122 on the LED wafer 12 is formed by dry etching and a sidewall 124 of the depression 122 is roughened, as shown in FIG. 4. In the embodiment, the dry etching makes use of inductively coupled plasma (ICP); alternatively, reactive ion etching (RIE) or high density plasma (HDP) can be used. The dry etching is a type of anisotropic etching, such that while the depression 122 is formed by the dry etching, the lateral surface 142 of the electrically conductive layer 14 will not deteriorate or be etched. Moreover, because the sidewall 124 of the depression 122 is flush with the lateral surface 142 of the electrically conductive layer 14, the sidewall 124 of the depression 122 is roughened along the lateral surface 142 of the electrically conductive layer 14 under the dry etching process. A degree of roughness of the sidewall 124 of the depression 122 is equal to a degree of roughness of the lateral surface 142 of the electrically conductive layer 14 due to a transfer printing of the dry etching. In the embodiment, the degree of roughness of the sidewall 124 of the depression 122 and the lateral surface 142 of the electrically conductive layer 14 is measurable in micrometers (μm). Due to these rough lateral surfaces, a light emitting efficiency of the LED and the light output from the LED can be enhanced.

Figure 5:
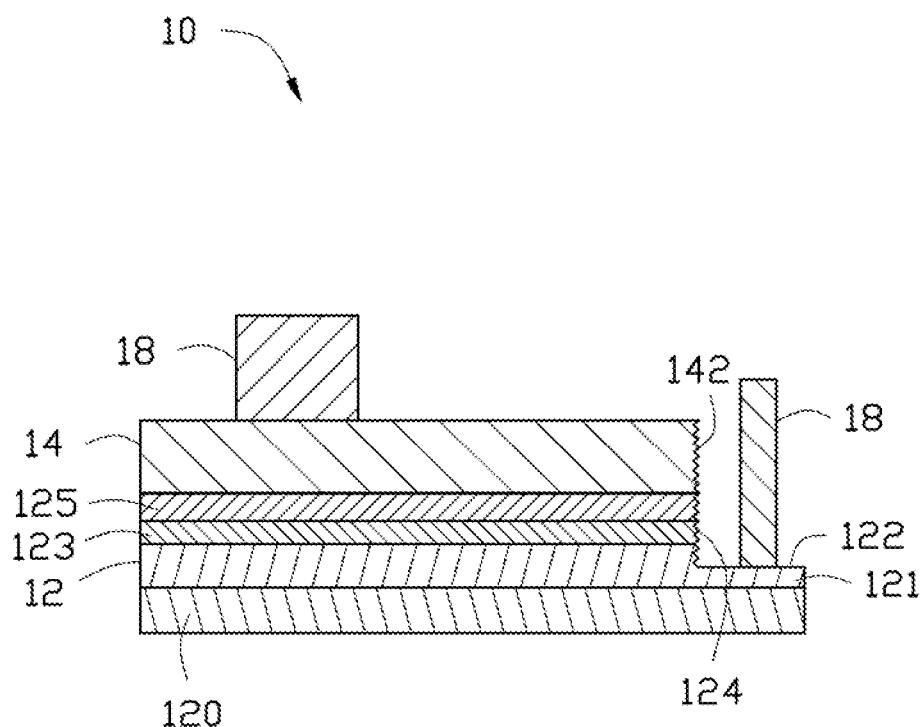
FIG. 5 is a cross section showing a step of disposing a pad on the depression and a pad on the electrically conducting layer in accordance with FIG. 1.

In step S15, two pads 18 are formed, in the depression 122 and on the electrically conducting layer 14, as shown in FIG. 5. In the embodiment, first, the photoresist layer 16 is removed from the electrically conducting layer 14; then, a pad 18 is disposed in the depression 122 and a pad 18 is disposed on the electrically conducting layer 14. The two pads 18 comprise an N-type electrode and a P-type electrode, wherein the N-type electrode is located in the depression 122 and on the N-type epitaxial layer 121, and the P-type electrode is located on the electrically conducting layer 14 which is on the P-type epitaxial layer 125. The two pads 18 can be an alloy of gold (Au) and chromium (Cr).

The disclosure also provides an LED 10, as shown in FIG. 5, which comprises an LED wafer 12, an electrically conducting layer 14 and two pads 18. The LED wafer 12 contains a substrate 120, an N-type epitaxial layer 121 on the substrate 120, a light emitting layer 123 on the N-type epitaxial layer 121, and a P-type epitaxial layer 125 on the light emitting layer 123, wherein a depression 122 is defined in a side of the LED wafer 12. The depression 122 is recessed downwardly from the P-type epitaxial layer 125, through the light emitting layer 123 to reach generally a middle of the N-type epitaxial layer 121, without reaching the substrate 120. The LED wafer 12 has a roughened sidewall 124 defining the depression 122. More specifically, the roughened sidewall 124 is continuously formed on lateral sides of the P-type epitaxial layer 125, the light emitting layer 123 and the N-type epitaxial layer 121 adjacent to the depression 122. Moreover, the electrically conductive layer 14 with a roughened lateral surface 142 is disposed on the P-type epitaxial layer 125. The two pads 18 comprise an N-type electrode and a P-type electrode respectively disposed on the N-type epitaxial layer 121 and the electrically conductive layer 14 to respectively electrically connect with the N-type epitaxial layer 121 and the P-type epitaxial layer 125. In the embodiment, the N-type electrode 18 is located inside the depression 122. The roughened sidewall 124 of the depression 122 is flush with the roughened lateral surface 142 of the electrically conductive layer 14, and a degree of roughness of the lateral surface 142 is equal to a degree of roughness of the sidewall 124. Moreover, the roughened sidewall 124 of the depression 122 and the roughened lateral surface 142 of the electrically conductive layer 14 form saw tooth shapes.

Accordingly, the LED 10 comprising roughened lateral surfaces promotes greater light emitting efficiency of the LED 10 and provides a significantly better light output from the LED 10. Moreover, the manufacturing method for the LED 10 with roughened lateral surfaces may only require two etching processes which are low cost and easily integrated into manufacture.

It is to be understood, however, that even though numerous characteristics and advantages of the disclosure have been set forth in the foregoing description, together with details of the structure and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A manufacturing method for a light emitting diode (LED), comprising following steps:
   providing an LED wafer, wherein an electrically conductive layer is disposed on the LED wafer, and the LED wafer comprises a substrate and an epitaxial layer on the substrate, the electrically conductive layer being located on the epitaxial layer;
   providing a photoresist layer on the electrically conductive layer;
   roughening a lateral surface of the electrically conductive layer by wet etching;
   forming a depression in the LED wafer by dry etching and roughening a sidewall of the LED wafer defining the depression, the depression being recessed in the epitaxial layer without reaching the substrate; and
   disposing two pads respectively in the depression and on the electrically conducting layer to electrically connect with different layers of the epitaxial layer;
   wherein the roughened sidewall of the LED wafer by the dry etching process is flush with the roughened lateral surface of the electrically conductive layer by the wet etching process.

2. The manufacturing method for the LED as claimed in claim 1, wherein the epitaxial layer of the LED wafer comprises an N-type gallium nitride (GaN) layer on the substrate, a light emitting layer on the N-type GaN layer and a P-type GaN layer on the light emitting layer, the electrically conductive being on the P-type GaN layer.

3. The manufacturing method for the LED as claimed in claim 2, wherein the electrically conductive layer is disposed on the P-type GaN layer.

4. The manufacturing method for the LED as claimed in claim 3, wherein the electrically conductive layer is made of indium tin oxide (ITO) by vapor deposition.

5. The manufacturing method for the LED as claimed in claim 1, in the step of providing the photoresist layer on the electrically conductive layer, wherein a portion of a top surface of the electrically conductive layer is exposed from the photoresist layer.

6. The manufacturing method for the LED as claimed in claim 1, in the step of roughening the lateral surface of the electrically conductive layer by wet etching, wherein the lateral surface of the electrically conductive layer is flush with a lateral surface of the photoresist layer.

7. The manufacturing method for the LED as claimed in claim 6, wherein the wet etching process makes use of potassium hydroxide (K.OH), hydrochloric acid (H.Cl) or phosphoric acid (H3{PO}4).

8. The manufacturing method for the LED as claimed in claim 1, wherein the step of roughening the sidewall of the LED wafer defining the depression sequentially follows the step of roughening the lateral surface of the electrically conductive layer by wet etching.

9. The manufacturing method for the LED as claimed in claim 8, wherein a degree of roughness of the lateral surface of the electrically conductive layer is equal to a degree of roughness of the sidewall of the depression.

10. The manufacturing method for the LED as claimed in claim 1, wherein the dry etching process makes use of inductively coupled plasma (ICP), reactive ion etching (RIE) or high density plasma (HDP).

11. The manufacturing method for the LED as claimed in claim 1, wherein the photoresist layer is removed from the electrically conductive layer before the step of disposing the two pads respectively in the depression and on the electrically conducting layer.

12. The manufacturing method for the LED as claimed in claim 1, wherein the two pads comprises an N-type electrode disposed in the depression and a P-type electrode disposed on the electrically conducting layer.

13. The manufacturing method for the LED as claimed in claim 12, wherein the two pads are alloy of gold (Au) and chromium (Cr).

14. The manufacturing method for the LED as claimed in claim 1, wherein a degree of roughness of the roughened sidewall of the LED wafer defining the depression is measurable in micrometers (μm).

* * * * *